(12) United States Patent
Umemoto et al.

(10) Patent No.: US 10,883,169 B2
(45) Date of Patent: Jan. 5, 2021

(54) SPUTTERING TARGET AND METHOD FOR PRODUCING SPUTTERING TARGET

(71) Applicants: MITSUBISHI MATERIALS CORPORATION, Tokyo (JP); Solar Frontier K.K., Tokyo (JP)

(72) Inventors: Keita Umemoto, Sanda (JP); Shoubin Zhang, Tokyo (JP); Yuya Mutsuda, Sanda (JP)

(73) Assignees: MITSUBISHI MATERIALS CORPORATION, Tokyo (JP); Solar Frontier K.K., Tokyo (JP)

(*) Notice: Subject to any disclaimer, the term of this patent is extended or adjusted under 35 U.S.C. 154(b) by 362 days.

(21) Appl. No.: 15/770,407

(22) PCT Filed: Oct. 24, 2016

(86) PCT No.: PCT/JP2016/081437
§ 371 (c)(1),
(2) Date: Apr. 23, 2018

(87) PCT Pub. No.: WO2017/073514
PCT Pub. Date: May 4, 2017

(65) Prior Publication Data
US 2018/0312961 A1    Nov. 1, 2018

(30) Foreign Application Priority Data

Oct. 26, 2015  (JP) ................... 2015-210173
Oct. 18, 2016  (JP) ................... 2016-204630

(51) Int. Cl.
| | |
|---|---|
| *C23C 14/34* | (2006.01) |
| *C22C 1/04* | (2006.01) |
| *C22C 9/00* | (2006.01) |
| *C23C 14/06* | (2006.01) |
| *C22C 28/00* | (2006.01) |

(Continued)

(52) U.S. Cl.
CPC .......... *C23C 14/3414* (2013.01); *B22F 9/082* (2013.01); *C22C 1/0483* (2013.01);
(Continued)

(58) Field of Classification Search
CPC .... B22F 9/082; B22F 2998/10; B22F 1/0011; C22C 1/0483; C22C 28/00; C22C 9/00;
(Continued)

(56) References Cited

U.S. PATENT DOCUMENTS

2011/0089030 A1   4/2011 Juliano et al.
2016/0118232 A1   4/2016 Zhang et al.

FOREIGN PATENT DOCUMENTS

CN   102515561 A   6/2012
CN   102560186 A   7/2012
(Continued)

OTHER PUBLICATIONS

Volobujeva et al., "SEM analysis and selenization of Cu-In alloy films produced by co-sputtering of metals", *Solar Energy Materials & Solar Cells*, 2009, pp. 11-14, vol. 93.
(Continued)

*Primary Examiner* — Rodney G McDonald
(74) *Attorney, Agent, or Firm* — Leason Ellis LLP

(57) ABSTRACT

The present invention provides a sputtering target having a composition containing 45 at % to 90 at % of In, and the remainder including Cu and inevitable impurities. An In single phase and a $Cu_{11}In_9$ compound phase exist, and an XRD peak ratio $I(In)/I(Cu_{11}In_9)$ between the In single phase and the $Cu_{11}In_9$ compound phase is in a range of 0.01 to 3. The average grain size of the $Cu_{11}In_9$ compound phase is 150 μm or less, the amount of oxygen is 500 mass ppm or less, and the theoretical density ratio is 85% or more.

4 Claims, 3 Drawing Sheets

(51) Int. Cl.
*B22F 9/08* (2006.01)
*B22F 1/00* (2006.01)

(52) U.S. Cl.
CPC .............. *C22C 9/00* (2013.01); *C22C 28/00* (2013.01); *C23C 14/06* (2013.01); *C23C 14/3421* (2013.01); *B22F 1/0011* (2013.01); *B22F 2998/10* (2013.01); *Y02E 10/541* (2013.01)

(58) Field of Classification Search
CPC . C23C 14/06; C23C 14/3414; C23C 14/3421; Y02E 10/541
USPC ........................................ 204/298.12, 298.13
See application file for complete search history.

(56) References Cited

FOREIGN PATENT DOCUMENTS

| | | |
|---|---|---|
| CN | 103114264 A | 5/2013 |
| JP | 2009-007626 A | 1/2009 |
| JP | 2009-120863 A | 6/2009 |
| JP | 2012-052190 A | 3/2012 |
| JP | 2012-079997 A | 4/2012 |
| JP | 2014-503687 A | 2/2014 |
| JP | 2015-028213 A | 2/2015 |
| TW | 201439340 A | 10/2014 |
| TW | 201506184 A | 2/2015 |
| WO | WO-2012/074609 A | 6/2012 |
| WO | WO-2013/069710 A | 5/2013 |
| WO | WO-2015/046319 A | 4/2015 |

OTHER PUBLICATIONS

Chung et al., "Phase formation and control of morphology in sputtered Cu-In alloy Layers", *Solid State Communications*, 2003, pp. 185-190, vol. 126.
International Search Report dated Jan. 10, 2017 for the corresponding PCT International Patent Application No. PCT/JP2016/081437.
Chinese Office Action dated Jul. 18, 2019 for the corresponding Chinese Patent Application No. 201680061310.1.
Taiwanese Notice of Allowance dated Feb. 27, 2020 for the corresponding Taiwanese Patent Application No. 105134436.

SPUTTERING TARGET AND METHOD FOR PRODUCING SPUTTERING TARGET

CROSS-REFERENCE TO RELATED PATENT APPLICATIONS

This application is a U.S. National Phase Application under 35 U.S.C. § 371 of International Patent Application No. PCT/JP2016/081437 filed on Oct. 24, 2016 and claims the benefit of Japanese Patent Applications Nos. 2015-210173, filed on Oct. 26, 2015, and 2016-204630, filed on Oct. 18, 2016, all of which are incorporated herein by reference in their entireties. The International Application was published in Japanese on May 4, 2017 as International Publication No. WO/2017/073514 under PCT Article 21(2).

FIELD OF THE INVENTION

The present invention relates to a sputtering target that is used when forming a thin film of an In—Cu alloy, and a method of manufacturing the sputtering target.

BACKGROUND OF THE INVENTION

In the related art, as a thin film solar cell that is constituted by a compound semiconductor, a CIGS-based solar cell, which includes a light-absorbing layer constituted by a Cu—In—Ga—Se-based alloy thin film, is widely provided.

Here, as a method of forming the light-absorbing layer that is constituted by the Cu—In—Ga—Se-based alloy thin film, a method of forming a film by a vapor deposition method is provided. The solar cell including the light-absorbing layer formed by the vapor deposition method has an advantage that energy conversion efficiency is high, but has a problem in that the film formation rate is slow, and the production efficiency is low.

Accordingly, as a method of forming the light-absorbing layer that is constituted by the Cu—In—Ga—Se-based alloy thin film, the following method is provided. That is, a thin film including In, Cu, and Ga, or a multilayer film of thin films which respectively include the elements, and the thin film or the multilayer film is subjected to a heat treatment in a Se atmosphere to form a selenium compound. A sputtering method using a sputtering target that includes each of the elements is applied to form the thin film including In, Cu, and Ga, or the multilayer film of the thin films which respectively include the elements.

Here, Japanese Unexamined Publication No. 2012-052190 suggests an indium target that includes 0.5 to 7.5 at % of Cu.

Japanese Unexamined Publication No. 2012-079997 suggests an In—Cu alloy sputtering target that includes 30 to 80 at % of Cu.

Japanese Unexamined Publication No. 2014-503687 suggests a sputtering target including copper and indium.

Technical Problem

However, in the indium target described in Japanese Unexamined Publication No. 2012-052190, the amount of Cu contained is small, and a lot of In single phases exist. Indium is very flexible. Therefore, when performing cutting, cutting chips are apt to adhere to a target surface. According to this, it is necessary to supply a large amount of cutting oil or to retard a working rate when performing cutting.

However, in a case of supplying a large amount of cutting oil, there is a concern that cutting oil components may be mixed in a film, which is formed, as impurities. In a case of adding a washing step to remove the cutting oil, a step increases, and the production cost increases. In addition, in a case of retarding the working rate, there is a problem in that production efficiency deteriorates.

In addition, in Japanese Unexamined Publication No. 2012-052190, a temperature of melting indium and copper which are raw materials is relatively as low as 260° C. to 320° C. Therefore, a part of Cu remains without being melted, and becomes an abnormal phase. Therefore, abnormal discharge is likely to occur during sputtering. According to this, it is difficult to increase the addition amount of Cu.

In addition, as described in Japanese Unexamined Publication No. 2012-079997, in a case where 30 to 80 at % of Cu is contained, rolling becomes difficult. Accordingly, the above-described In—Cu alloy sputtering target is manufactured by a powder sintering method. Here, it is necessary to make a crystal grain size of the sputtering target fine so as to suppress abnormal discharge during sputtering. However, in a case where a raw material powder used in sintering is made to be fine, the amount of oxygen in the target increases. Therefore, there is a problem in that abnormal discharge is likely to occur.

In addition, in Japanese Unexamined Publication No. 2014-503687, focus is provided to a target including Ga in combination with Cu and In, and a large amount of Cu is contained. Therefore, ductility is not sufficient, and there is a concern that cracking and the like may occur during working. As a result, production efficiency is poor.

The invention has been made in consideration of the above-described circumstances, and an object thereof is to provide a sputtering target that is formed from an In—Cu alloy, is excellent in workability, and is capable of suppressing occurrence of abnormal discharge during sputtering, and a method of manufacturing the sputtering target.

SUMMARY OF THE INVENTION

Solution to Problem

To solve the above-described problem, according to an aspect of the invention, there is provided a sputtering target having a composition containing 45 at % to 90 at % of In, and the remainder including Cu and unavoidable impurities. An In single phase and a $Cu_{11}In_9$ compound phase exist, and an XRD peak ratio $I(In)/I(Cu_{11}In_9)$ between the In single phase and the $Cu_{11}In_9$ compound phase is in a range of 0.01 to 3. The average grain size of the $Cu_{11}In_9$ compound phase is 150 μm or less, the amount of oxygen is 500 mass ppm or less, and the theoretical density ratio is set to 85% or more.

According to the sputtering target having the above-described configuration, the sputtering target has a composition containing 45 at % to 90 at % of In, and the remainder including Cu and unavoidable impurities. In addition, since an In single phase and a $Cu_{11}In_9$ compound phase that is harder than the In single phase exist, the $Cu_{11}In_9$ compound phase becomes the origin of fracture. Accordingly, cutting workability is greatly improved.

In addition, an XRD peak ratio $I(In)/I(Cu_{11}In_9)$ between the In single phase and the $Cu_{11}In_9$ compound phase is in a range of 0.01 to 3. Accordingly, the In single phase excellent in ductility and the $Cu_{11}In_9$ compound phase that becomes the origin of fracture exist with satisfactory balance. As a result, it is possible to limit occurrences of cracking or damage during working, and it is possible to reliably improve cutting workability.

In addition, in the sputtering target according to the aspect of the invention, an average grain size of the $Cu_{11}In_9$ compound phase is set to 150 µm or less. Accordingly, it is possible to limit occurrences of chipping in cutting, and it is possible to limit occurrences of abnormal discharge that is caused by a chipping trace.

In addition, in the sputtering target according to the aspect of the invention, the amount of oxygen is 500 mass ppm or less, and a theoretical density ratio is set to 85% or more. Accordingly, it is possible to limit occurrences of abnormal discharge during sputtering. As a result, it is possible to perform stable film formation.

Here, in the sputtering target according to the aspect of the invention, the average grain size of the In single phase may be set to 1 mm or less.

In this case, since the average grain size of the In single phase is relatively as fine as 1 mm or less, even in a case where a target surface is consumed due to sputtering, unevenness of the target surface is suppressed. As a result, it is possible to limit occurrences of abnormal discharge during sputtering.

In addition, the sputtering target according to the aspect of the invention may further contain one or more selected from the group consisting of NaF, NaCl, $Na_2S$, and $Na_2Se$ as a Na compound, and the average grain size of the Na compound may be set to 10 µm or less.

In this case, since the above-described Na compound is contained, it is possible to form a thin film including Na that is an alkali metal. In addition, since the average grain size of the Na compound is set to 10 µm or less, it is possible to limit occurrences of abnormal discharge during sputtering.

In addition, the sputtering target according to the aspect of the invention may further contain one or two selected from the group consisting of KF, KCl, $K_2S$, and $K_2Se$ as a K compound, and an average grain size of the K compound may be set to 10 µm or less.

In this case, since the above-described K compound is contained, it is possible to form a thin film including K that is an alkali metal. In addition, since the average grain size of the K compound is set to 10 µm or less, it is possible to limit occurrences of abnormal discharge during sputtering.

Here, in a solar cell including a Cu—In—Ga—Se-based alloy thin film as a light-absorbing layer, when an alkali metal is added to the Cu—In—Ga—Se-based alloy thin film, conversion efficiency is improved. Accordingly, as described above, when forming the Cu—In—Ga—Se-based alloy thin film by using a sputtering target that contains the Na compound including Na that is an alkali metal or the K compound including K that is an alkali metal, it is possible to manufacture a solar cell excellent in conversion efficiency.

According to another aspect of the invention, there is provided a method of manufacturing a sputtering target. The method includes: an In—Cu alloy powder preparing step of preparing an In—Cu alloy powder, which has a composition containing 45 at % to 90 at % of In, and the remainder including Cu and inevitable impurities, and in which an In single phase and a $Cu_{11}In_9$ compound phase exist, an XRD peak ratio $I(In)/I(Cu_{11}In_9)$ between the In single phase and the $Cu_{11}In_9$ compound phase is in a range of 0.01 to 3, the concentration of oxygen is 500 mass ppm or less, and the average particle size is set to 125 µm or less, by gas atomizing in which a spraying temperature is set to 700° C. to 900° C.; and a sintering step of sintering a raw material powder including the In—Cu alloy powder.

According to the above-described method of manufacturing a sputtering target, since the In—Cu alloy powder, which has the above-described composition, and in which the In single phase and the $Cu_{11}In_9$ compound phase exist, the XRD peak ratio $I(In)/I(Cu_{11}In_9)$ between the In single phase and the $Cu_{11}In_9$ compound phase is in a range of 0.01 to 3, and the average particle size is set to 125 µm or less, is used, it is possible to manufacture the above-described sputtering target of the invention.

The method of manufacturing the sputtering target according to the aspect of the invention may further include: a raw material blending step of weighing a Cu raw material and an In raw material to obtain a composition containing 45 at % to 90 at % of In, and the remainder including Cu and inevitable impurities; a melting step of forming a molten metal by heating the Cu raw material and the In raw material to 1100° C. or more to be melted; and a casting step of pouring the molten metal into a casting mold and cooling the molten metal to 50° C. or lower at a cooling rate of 10° C./min or more.

According to the above-described method of manufacturing a sputtering target, since the method includes the melting step of heating the Cu raw material and the In raw material to 1100° C. or more, it is possible to completely melt the Cu raw material. In addition, since the method includes the casting step of cooling the molten metal to 50° C. or lower at a cooling rate of 10° C./min or more, a crystal structure becomes fine. Accordingly, it is possible to set the average grain size of the $Cu_{11}In_9$ compound phase to 150 µm or less. In addition, it is possible to form the In single phase and the $Cu_{11}In_9$ compound phase with satisfactory balance. Accordingly, it is possible to manufacture the sputtering target of the invention.

Advantageous Effects of Invention

According to the invention, it is possible to provide a sputtering target that is formed from an In—Cu alloy, is excellent in workability, and is capable of suppressing occurrence of abnormal discharge during sputtering, and a method of manufacturing the sputtering target.

BRIEF DESCRIPTION OF THE DRAWINGS

FIG. 1(a) is a reflected electron composition image, FIG. 1(b) is an element mapping image of Cu, and FIG. 1(c) is an element mapping image of In.

DETAILED DESCRIPTION OF THE INVENTION

Hereinafter, a sputtering target according to an embodiment of the invention, and a method of manufacturing the sputtering target will be described with reference to the accompanying drawings.

The sputtering target according to this embodiment has a composition that contains 45 at % to 90 at % of In, and the remainder including Cu and inevitable impurities. In addition, the amount of oxygen is limited to 500 mass ppm or less.

In the sputtering target according to this embodiment, a theoretical density ratio (a relative density to a theoretical density calculated from the composition ratio) is set to 85% or more.

Figure 1:
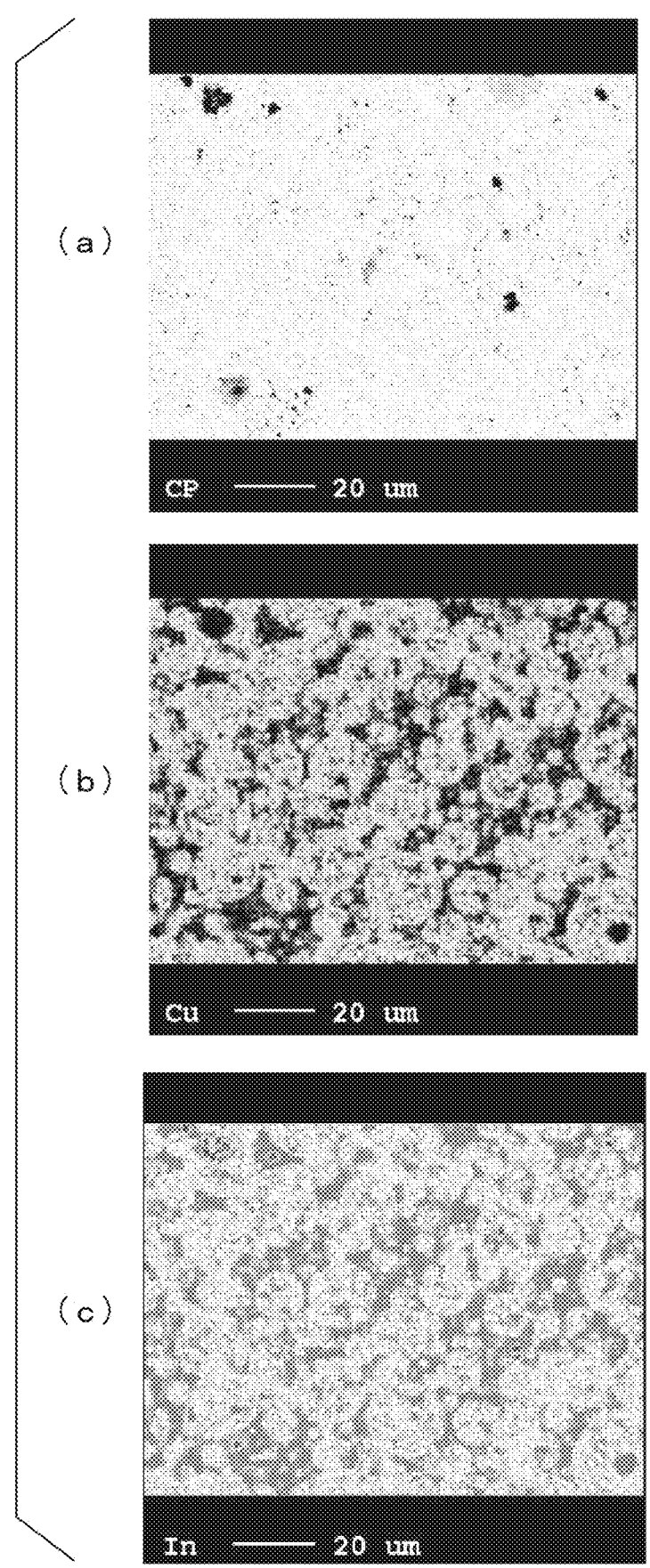
FIG. 1 is an example of a structure observation photograph of a sputtering target according to an embodiment of the invention.
Figure 2:
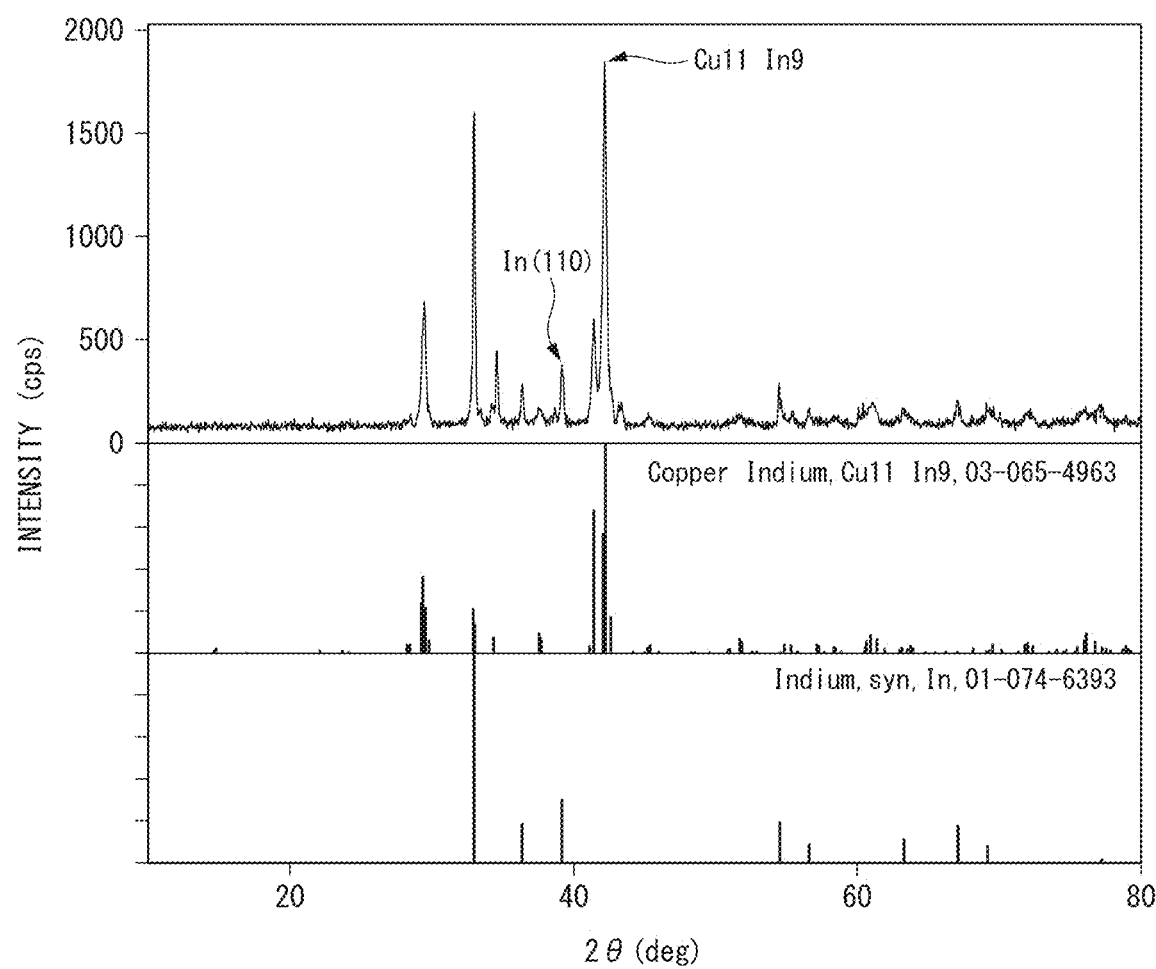
FIG. 2 is an example of XRD results of the sputtering target according to the embodiment of the invention.

In the sputtering target according to this embodiment, as shown in FIG. 1 and FIG. 2, an In single phase and a $Cu_{11}In_9$ compound phase exist. In addition, as shown in FIG. 2, an XRD peak ratio $I(In)/I(Cu_{11}In_9)$ between the In single phase and the $Cu_{11}In_9$ compound phase (hereinafter, the XRD peak ratio $I(In)/I(Cu_{11}In_9)$ between the In single phase and the $Cu_{11}In_9$ compound phase may be referred to as an existence ratio of the In single phase) is set in a range of 0.01 to 3.

Here, the average grain size of the $Cu_{11}In_9$ compound phase is set to 150 μm or less, and the average grain size of the In single phase is set to 1 mm or less.

In addition, in this embodiment, one or more selected from the group consisting of NaF, NaCl, $Na_2S$, and $Na_2Se$ may be further contained as a Na compound, and the average grain size of the Na compound may be set to 10 μm or less.

In addition, one or two selected from the group consisting of KF, KCl, $K_2S$, and $K_2Se$ may be further contained as a K compound, and the average grain size of the K compound may be set to 10 μm or less.

Hereinafter, a description will be provided of the reason why the amount of In contained, the XRD peak ratio between the In single phase and the $Cu_{11}In_9$ compound phase, the grain size of the $Cu_{11}In_9$ compound phase, the grain size of the In single phase, the amount of oxygen, the theoretical density ratio, the Na compound, and the K compound in the sputtering target according to this embodiment are defined as described above.

(In: 45 at % to 90 at %)

When Cu is added to In, the $Cu_{11}In_9$ compound phase, which is harder than In, is formed. Accordingly, it is possible to greatly improve cutting workability. In addition, it is possible to make a crystal grain size fine.

Here, when the amount of In contained is less than 45 at %, the In single phase decreases. Therefore, it may be difficult to increase the density of the target. On the other hand, when the amount of In contained is greater than 90 at %, the $Cu_{11}In_9$ compound phase is not sufficiently formed. Therefore, it may be difficult to improve the cutting workability.

From the above-described reasons, in this embodiment, the amount of In contained is set in a range of 45 at % to 90 at %.

Furthermore, when the amount of In contained is set to 70 at % or more, rolling becomes possible. Accordingly, it is possible to greatly improve production efficiency of the sputtering target. It is preferable that the amount of In contained is set in a range of 55 at % to 80 at %, and more preferably in a range of 60 at % to 70 at %. However, there is no limitation to the ranges.

(XRD Peak Ratio $I(In)/I(Cu_{11}In_9)$ Between In Single Phase and $Cu_{11}In_9$ Compound Phase: 0.01 to 3)

In a case where $I(In)/I(Cu_{11}In_9)$ is less than 0.01, a ratio of the In single phase excellent in ductility is small. Therefore, there is a concern that cracking or damage may occur in working. On the other hand, $I(In)/I(Cu_{11}In_9)$ is greater than 3, the ratio of the $Cu_{11}In_9$ compound phase decreases. Therefore, it may be difficult to sufficiently improve the cutting workability.

From the above-described reasons, in this embodiment, the XRD peak ratio $I(In)/I(Cu_{11}In_9)$ between the In single phase and the $Cu_{11}In_9$ compound phase is set in a range of 0.01 to 3. It is preferable that the XRD peak ratio $I(In)/I(Cu_{11}In_9)$ between the In single phase and the $Cu_{11}In_9$ compound phase is set in a range of 0.1 to 2.5, and more preferably 0.5 to 2. However, there is no limitation to the ranges.

In this embodiment, $I(Cu_{11}In_9)$ is set as a peak intensity pertaining to a (313) plane of $Cu_{11}In_9$ (DB card 01-065-4963).

In addition, I(In) is set as a peak intensity pertaining to a (110) plane of In (DB card 01-074-6393). Furthermore, a main peak of In exists in (101), but the (110) plane is used in calculation of I(In) when considering that the main peak of In overlaps the peak of (310) of $Cu_{11}In_9$.

(Average Grain Size of $Cu_{11}In_9$ Compound Phase: 150 μm or Less)

As described above, when the $Cu_{11}In_9$ compound phase exists, the cutting workability is improved. However, when the average grain size of the $Cu_{11}In_9$ compound phase becomes as coarse as greater than 150 μm, the coarseness becomes a cause for chipping in cutting. In addition, there is a concern that abnormal discharge may occur during sputtering due to chipping traces.

From the above-described reasons, in this embodiment, the average grain size of the $Cu_{11}In_9$ compound phase is limited to 150 μm or less.

Furthermore, it is preferable that the average grain size of the $Cu_{11}In_9$ compound phase is set to 100 μm or less so as to reliably limit occurrences of the chipping. In addition, the lower limit of the average grain size of the $Cu_{11}In_9$ compound phase is not particularly limited, but it is preferable that the average grain size is set to 1 μm or more so as to reliably improve the cutting workability. The average grain size of the $Cu_{11}In_9$ compound phase is preferably set to 30 μm or less, but there is no limitation thereto.

(Average Grain Size of in Single Phase: 1 mm or Less)

As described above, when an appropriate amount of Cu is added, even though the sputtering target is manufactured by a melting and casting method, the grain size of the In single phase becomes fine. In addition, in a case where the sputtering target is manufactured by a powder sintering method, the particle size of a powder raw material may be set to 1 mm or less.

Here, when the average grain size of the In single phase is limited to 1 mm or less, it is possible to limit occurrences of abnormal discharge.

Furthermore, it is preferable that the average grain size of the In single phase is set to 5 μm or less so as to reliably limit occurrences of abnormal discharge. In addition, although the lower limit of the average grain size of the In single phase is not particularly limited, the lower limit is preferably set to 0.010 μm or more.

(Amount of Oxygen: 500 Mass Ppm or Less)

When the amount of oxygen in the sputtering target is greater than 500 mass ppm, abnormal discharge or a nodule is likely to occur due to an oxide that exists in a target structure. According to this, in this embodiment, the amount of oxygen in the sputtering target is limited to 500 mass ppm or less. Furthermore, in a powder sintering method, when a grain size of a powder raw material is made to be fine, a specific surface area increases, and the amount of oxygen in a raw material powder tends to increase. Accordingly, it is necessary to define manufacturing conditions of the powder raw material as to be described later so as to reduce the amount of oxygen in the sputtering target. The lower limit of the amount of oxygen in the sputtering target is not particularly limited, but the lower limit is preferably set to 10 mass ppm or more. It is preferable that the amount of oxygen in the sputtering target is 300 mass ppm or less, and more preferably 150 mass ppm or less. However, the amount of oxygen is not limited thereto.

(Theoretical Density Ratio: 85% or More)

When the theoretical density ratio of the sputtering target is less than 85%, a lot of voids exist. Therefore, there is a concern that abnormal discharge is likely to occur during sputtering. Accordingly, in this embodiment, the theoretical density ratio is defined as 85% or more.

Furthermore, the theoretical density ratio fluctuates in accordance with a Cu/In ratio. According to this, in this embodiment, a molten metal having the Cu/In ratio is melted, and the resultant molten metal is cast and is gradually cooled down (a cooling rate: 5° C./min or less). The density of a defect-free ingot (10 cm×10 cm×10 cm) obtained in the above-described manner is set as the "theoretical density".

(Na Compound and K Compound: Average Grain Size of 10 μm or Less)

When the Na compound and the K compound are contained in the sputtering target, an alkali metal can be contained in an In film that is formed. Here, in a solar cell including a Cu—In—Ga—Se-based alloy thin film as a light-absorbing layer, when the alkali metal is added to the Cu—In—Ga—Se-based alloy thin film, conversion efficiency is greatly improved. According to this, the Na compound or the K compound may be contained in the sputtering target of this embodiment. Furthermore, it is preferable that the amount of the Na compound contained and the amount of the K compound contained are respectively set in a range of 0.1 at % to 10 at % in terms of a Na component and a K component. In a case where the amount is less than 0.1 at %, it is difficult to obtain a conversion efficiency improving effect due to addition, and in a case where the amount is greater than 10 at %, abnormal discharge due to the Na compound or the K compound frequently occurs. As a result, sputtering may be difficult. It is preferable that the amount of the Na compound contained and the amount of the K compound contained are respectively set in a range of 0.2 at % to 3 at % in terms of the Na compound and the K compound, but there is no limitation thereto.

Here, when the average grain size of the Na compound or the K compound is greater than 10 μm, there is a concern that abnormal discharge may occur during sputtering. Therefore, in this embodiment, in a case where the Na compound and the K compound are contained, the average grain size of the compounds is limited to 10 μm or less. The lower limit of the average grain size of the Na compound or the K compound is not particularly limited, but it is preferably set to 1 μm or more. It is preferable that the average grain size of the Na compound or the K compound is preferably 5 μm or less, but there is no limitation thereto.

Next, a description will be provided of a method of manufacturing the sputtering target according to this embodiment. The sputtering target according to this embodiment can be manufactured by a powder sintering method. In addition, when the amount of In contained is 70 at % or less, it is also possible to manufacture the sputtering target by a melting and casting method.

Hereinafter, the melting and casting method and the powder sintering method will be described with reference to flowchart in FIG. 3 and FIG. 4.

<Melting and Casting Method>

Figure 3:
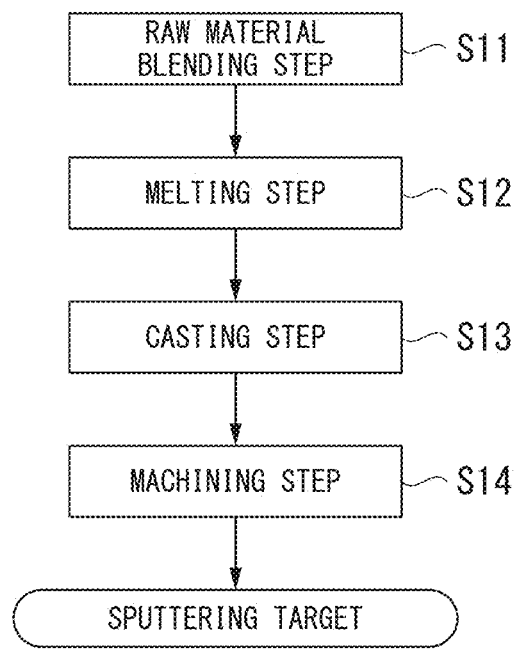
FIG. 3 is a flowchart showing a method (melting and casting method) of manufacturing the sputtering target according to the embodiment of the invention.

First, as shown in FIG. 3, a Cu raw material and an In raw material are prepared, and the Cu raw material and the In raw material are weighed so that In is contained in a range of 45 at % to 90 at %, and the remainder includes Cu and inevitable impurities (raw material blending step S11).

Next, the Cu raw material and the In raw material, which are weighed, are melted by using a vacuum melting furnace and the like (melting step S12).

Here, in a case where a melting temperature is set to lower than 1100° C., the Cu raw material is not completely melted, and a grain size of the $Cu_{11}In_9$ compound phase in a target structure increases. Therefore, abnormal discharge is likely to occur. According to this, in this embodiment, the melting temperature is set to 1100° C. or more. In addition, melting is performed in vacuum, or in an inert gas atmosphere. In a case of performing the melting in vacuum, a vacuum degree is preferably set to 10 Pa or less. In a case of performing the melting in an inert gas atmosphere, it is preferable that vacuum substitution is performed, and the vacuum degree at this time is set to 10 Pa or lower. When defining the vacuum degree as described above, it is possible to reduce the amount of oxygen in an ingot. It is preferable that the melting temperature is set to 1100° C. to 1300° C., and more preferably 1150° C. to 1200° C., but there is no limitation thereto.

Next, a molten metal, which is obtained, is poured into a casting mold and is cast (casting step S13). In the casting step S13, the molten metal is cooled down to 50° C. or lower at a cooling rate of 10° C./min or more.

Here, in a case where the cooling rate in casting is less than 10° C./min, the $Cu_{11}In_9$ compound phase is not sufficiently dispersed. Therefore, there is a concern that workability may not be improved. In addition, the $Cu_{11}In_9$ compound phase becomes coarse, and the coarsening becomes a cause for abnormal discharge. According to this, in this embodiment, the cooling rate in casting is set to 10° C./min or more. In addition, feeder head is performed after pouring so as to prevent a decrease in density due to the occurrence of shrinkage cavities during pouring. It is preferable that a cooling rate in casting is set to 10° C./min to 30° C./min, and more preferably 15° C./min to 20° C./min, but there is no limitation thereto.

With respect to an ingot obtained in this manner, hot-rolling, lathe machining, milling, and the like are performed (machining step S14). According to this, a sputtering target having a predetermined shape is obtained.

<Powder Sintering Method>

Figure 4:
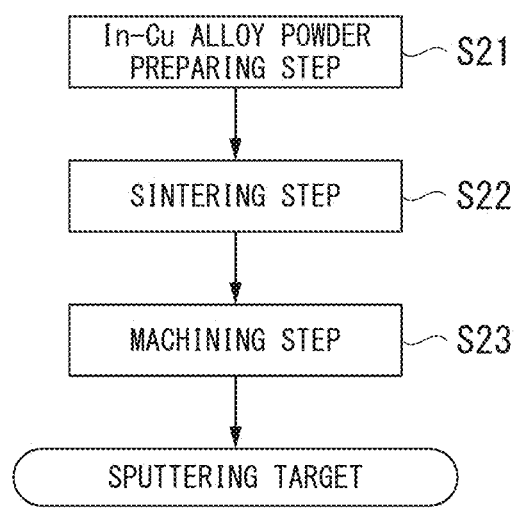
FIG. 4 is a flowchart showing a method (powder sintering method) of manufacturing the sputtering target according to the embodiment of the invention.

First, as shown in FIG. 4, an In—Cu alloy powder, which has a composition containing 45 at % to 90 at % of In, and the remainder including Cu and inevitable impurities, and in which an In single phase and a $Cu_{11}In_9$ compound phase exist, an XRD peak ratio $I(In)/I(Cu_{11}In_9)$ between the In single phase and the $Cu_{11}In_9$ compound phase is in a range of 0.01 to 3, and an average particle size is set to 125 μm or less, is prepared (In—Cu alloy powder preparing step S21).

In the In—Cu alloy powder preparing step S21, first, a Cu raw material and an In raw material are prepared, and are blended to obtain the above-described composition. Then, the resultant blended material is pulverized by a gas atomizing method, and is sorted by using a sieve having a hole diameter of 125 μm, thereby obtaining the above-described In—Cu alloy powder.

Furthermore, with regard to the In—Cu alloy powder that is obtained, it is confirmed that the XRD peak ratio $I(In)/I(Cu_{11}In_9)$ between the In single phase and the $Cu_{11}In_9$ compound phase is set in a range of 0.01 to 3.

As gas atomizing conditions, the peak vacuum degree during Ar substitution is set to 10 Pa or lower, a temperature in melting is set to 1100° C. to 1200° C., a spraying temperature is set to 700° C. to 900° C., a spraying gas pressure is set to 15 gf/cm² to 40 kgf/cm², and a nozzle diameter is set to 0.5 mm to 3 mm.

Here, in a case where the spraying temperature in gas atomizing is lower than 700° C., there is a concern that a generation ratio of the $Cu_{11}In_9$ compound phase increases. Therefore, there is a concern that the amount of In generated may decrease. According to this, in a case where the amount of In contained is relatively as small as 45 to 55 at %, particularly, attention is necessary to be paid. In addition, a crucible is likely to be clogged during atomizing. On the other hand, when the spraying temperature is higher than 900° C., a ratio of In in the raw material powder that is obtained further increases in comparison to a ratio that is obtained from an In—Cu phase diagram, and the $Cu_{11}In_9$ compound phase becomes deficient. Accordingly, there is a concern that cutting workability is not improved. In addition, there is a concern that a powder adheres to the inside of a chamber during atomizing, and a yield ratio of the powder may decrease. From the above-described viewpoints, in this embodiment, the spraying temperature in gas atomizing is set in a range of 700° C. to 900° C. It is preferable that the spraying temperature in gas atomizing is set in a range of 750° C. to 850° C., and more preferably a range of 750° C. to 800° C., but there is no limitation to the ranges.

In addition, when the peak vacuum degree during Ar substitution is set to 10 Pa or lower, it is possible to set the amount of oxygen in the In—Cu alloy powder that is manufactured to 500 mass ppm or less. It is preferable that the peak vacuum degree during Ar substitution is set to 0.1 Pa to 5 Pa, and more preferably 0.5 Pa to 1 Pa, but there is no limitation thereto.

Furthermore, the powder that is obtained is sorted by using a sieve of 125 μm or less. It is preferable that the average particle size of the In—Cu alloy powder is set to 5 μm to 50 μm, and more preferably 20 μm to 30 μm, but there is no limitation thereto.

Next, a mold is filled with the In—Cu alloy powder that is obtained, and pressure sintering is performed (sintering step S22). In the sintering step S22, a heating temperature is set to a temperature lower than the melting temperature of In by 10° C. to 40° C., pressure is set to 200 to 1000 kg/cm², and retention time is set to 1 to 3 hours. In addition, an atmosphere in sintering is set to a vacuum of 10 Pa or less or an inert gas such as Ar to prevent oxidation of the raw material powder. According to this, it is possible to control an oxygen concentration to 500 mass ppm or less even in a sintered body. Furthermore, in a case of performing sintering in an inert gas atmosphere, an inert gas is introduced through vacuum substitution. The peak vacuum degree at this time is set to 10 Pa or less. In addition, since the raw material powder sorted to 125 μm or less is used, it is possible to obtain a sintered body having an average grain size of 150 μm or less even in a sintered body. It is possible to obtain a sintered body having a theoretical density ratio of 85% or more under the above-described conditions.

With respect to the sintered body that is obtained in this manner, lathe machining, milling, and the like are performed (machining step S23). According to this, a sputtering target having a predetermined shape is obtained.

According to the sputtering target having the above-described configuration according to this embodiment, since the sputtering target having a composition in which In is contained in a range of 45 wt % to 90 wt % and the remainder includes Cu and inevitable impurities, and which includes the $Cu_{11}In_9$ compound phase that is harder than the In single phase, the $Cu_{11}In_9$ compound phase becomes the origin of fracture in cutting. Accordingly, it is possible to greatly improve cutting workability.

In addition, in this embodiment, since the XRD peak ratio $I(In)/I(Cu_{11}In_9)$ between the In single phase and the $Cu_{11}In_9$ compound phase is set to 0.01 or more, it is possible to limit occurrences of cracking and the like during working when considering that the In single phase sufficiently exists and ductility is secured. In addition, since the $I(In)/I(Cu_{11}In_9)$ is set in a range of 3 or less, the $Cu_{11}In_9$ compound phase sufficiently exists. Accordingly, it is possible to reliably improve cutting workability.

In addition, in this embodiment, since the average grain size of the $Cu_{11}In_9$ compound phase is set to 150 μm or less, it is possible to limit occurrences of chipping in cutting, and it is possible to limit occurrences of abnormal discharge that is caused by chipping traces.

In addition, in this embodiment, since the amount of oxygen is 500 mass ppm or less, and the theoretical density ratio is set to 85% or more, it is possible to limit occurrences of abnormal discharge during sputtering. As a result, it is possible to perform stable film formation.

In addition, in this embodiment, since the average grain size of the In single phase is relatively as fine as 1 mm or less, even in a case where a target surface is consumed due to progress of sputtering, unevenness on the target surface is suppressed. Accordingly, it is possible to limit occurrences of abnormal discharge.

In addition, in this embodiment, in a case where one or more selected from the group consisting of NaF, NaCl, $Na_2S$, and $Na_2Se$ are contained as a Na compound, and an average grain size of the Na compound is set to 10 μm or less, or in a case where one or two selected from the group consisting of KF, KCl, $K_2S$, and $K_2Se$ are contained as a K compound, and an average grain size of the K compound is set to 10 μm or less, it is possible to form an In film that includes an alkali metal. When forming a Cu—In—Ga—Se-based alloy thin film by using the In film, it is possible to improve conversion efficiency of a CIGS-based solar cell.

In addition, since the average grain size of the Na compound and the K compound is limited to 10 μm or less, it is possible to limit occurrences of abnormal discharge during sputtering.

In addition, according to the method of manufacturing the sputtering target by using the melting and casting method according to this embodiment, since the method includes the melting step S12 in which heating to 1100° C. or more is performed, it is possible to completely melt the Cu raw material. In addition, the method includes the casting step S13 of cooling down the molten metal to 50° C. or lower at a cooling rate of 10° C./min or more, a crystal structure becomes fine. Accordingly, it is possible to set the average grain size of the $Cu_{11}In_9$ compound phase to 150 μm or less. In addition, it is possible to set the XRD peak ratio $I(In)/I(Cu_{11}In_9)$ between the In single phase and the $Cu_{11}In_9$ compound phase to a range of 0.01 to 3 due to the melting step S12 and the casting step S13.

In addition, according to the method of manufacturing the sputtering target by using the powder sintering method according to this embodiment, the method includes the In—Cu alloy powder preparing step S21 of preparing the In—Cu alloy powder which has a composition containing 45 at % to 90 at % of In, and the remainder including Cu and inevitable impurities, and in which the In single phase and the $Cu_{11}In_9$ compound phase exist, the XRD peak ratio $I(In)/I(Cu_{11}In_9)$ between the In single phase and the $Cu_{11}In_9$ compound phase is in a range of 0.01 to 3, and the average particle size is set to 125 μm or less. In the In—Cu alloy powder preparing step S21, since the gas atomizing method is applied, and the spraying temperature in the gas atomizing is set to a range of 700° C. to 900° C., it is possible to obtain an In—Cu alloy powder that contains the In single phase and the $Cu_{11}In_9$ compound phase with balance.

In addition, since the method includes the sintering step S22 in which a mold is filled with the In—Cu alloy powder, and pressure sintering is performed, it is possible to manufacture the sputtering target according to this embodiment.

Hereinbefore, description has been provided of the embodiment of the invention. However, the invention is not limited thereto, and can be appropriately modified in a range not departing from the technical spirit of the invention.

For example, in this embodiment, description has been provided on the assumption that the average grain size of the In single phase is set to 1 mm or less, but there is no limitation thereto.

EXAMPLES

Hereinafter, description will be provided of results of an evaluation test on an operation effect of the sputtering target and the method of manufacturing the sputtering target according to the invention.

Examples 1 to 19, and Comparative Examples 1 to 8

Sputtering targets for evaluation according to Examples 1 to 19 and Comparative Examples 1 to 8 were manufactured by a powder sintering method.

A Cu metal ingot with purity of 99.99 mass % or more, and an In metal ingot with purity of 99.99 mass % or more were prepared. The raw materials were weighed to a total weight of 1200 g in a blending ratio shown in Table 1. A carbon crucible was filled with the weighed raw materials, and melting of the raw materials was performed. Then, an In—Cu alloy powder was prepared by the gas atomizing method under the conditions described in the embodiment. Furthermore, a nozzle diameter during atomizing was set to 1.5 mm except for Comparative Example 4.

The resultant In—Cu alloy powder that was obtained, a Cu powder, and an alkali metal compound powder as necessary were mixed in a blending ratio shown in Table 1 by using a locking mixer.

In addition, the resultant mixed powder was subjected to pressure sintering under conditions shown in Table 2. A sintered body that was obtained was worked into a sputtering target having a size of 126 mm×178 mm×6 mm (thickness) by using a lathe and a milling machine.

In Comparative Examples 3, 4, 5, 6, and 7, conditions were changed as follows from the above-described manufacturing method. In Comparative Example 3, a spraying temperature in atomizing was set to 680° C. In Comparative Example 4, the nozzle diameter in atomizing was set to 3 mm, and a sieve of 1000 μm was used as a sieve after the atomizing. In Comparative Example 5, the peak vacuum degree during atomizing was set to 100 Pa. In Comparative examples 6 and 7, in the In—Cu alloy powder preparing step, an alkali metal compound powder having an average particle size of 50 μm was used as a raw material, and mixing of raw materials was performed at 85 rpm for 30 minutes by using a locking mixer.

Examples 20 and 21, and Comparative Examples 9 to 11

Sputtering targets for evaluation according to Examples 20 and 21, and Comparative Examples 9 to 11 were manufactured by a melting and casting method.

A Cu metal ingot with purity of 99.99 mass % or more, and an In metal ingot with purity of 99.99 mass % or more were prepared. The raw materials were weighed to a total weight of 3500 g in a blending ratio shown in Table 3.

A carbon crucible was filled with the weighed raw materials, and melting of the raw materials was performed in an atmosphere and temperature retention time which are shown in Table 3. Then, the resultant molten metal was poured into a mold of 170 mm×220 mm×11 mm (thickness), and a molten metal was appropriately added to the mold so as to prevent generation of a shrinkage cavity. Then, cooling was performed up to 50° C. at a cooling rate shown in Table 3.

The resultant ingot that was obtained was worked into a sputtering target having a size of 126 mm×178 mm×6 mm (thickness) by using a lathe and a milling machine.

(In Single Phase Existence Ratio)

First, with regard to the In—Cu alloy powders and the sputtering targets, the XRD peak ratio $I(In)/I(Cu_{11}In_9)$ between the In single phase and the $Cu_{11}In_9$ compound phase was obtained as follows.

With regard to each of the In—Cu alloy powders, the In—Cu alloy powder that was obtained was used as a measurement sample without working. With regard to each of the sputtering targets, a fragment was collected, the fragment was wet-polished with SiC-paper (grit: 1000). Then, the polished fragment was set as a measurement sample after being dried. In addition, measurement was performed under the following conditions.

Apparatus: RINT-Ultima/PC (manufactured by Rigaku Corporation)
Tubular bulb: Cu
Tube voltage: 40 kV
Tube current: 40 mA
Scanning range (2θ): 10° to 80°
Slit size: Divergence (DS) of ⅔°, scattering (SS) of ⅔°, and light reception (RS) of 0.8 mm
Measurement step width: 0.02° in 2θ
Scanning speed: 2° per every minute
Sample stage rotation speed: 30 rpm The In single phase existence ratio was obtained from a peak intensity pertaining to a (110) plane of the In single phase and a peak intensity pertaining to a (313) plane of the $Cu_{11}In_9$ compound phase in a diffraction pattern (referred to FIG. 2), which was acquired under the above-described conditions, by the following calculation expression. Measurement results of the In—Cu alloy powders are shown in Table 1, and evaluation results of the sputtering targets are shown in Table 4 and Table 5.

(In Single Phase Existence Ratio)=$I(In)/I(Cu_{11}In_9)$

Here, I(In) represents a peak intensity pertaining to a (110) plane of In (DB card 01-074-6393), and $I(Cu_{11}In_9)$ represents a peak intensity pertaining to a (313) plane of In (DB card 03-065-4963).

(Amount of Oxygen Contained)

The amount of oxygen contained in each of the In—Cu alloy powders and the sputtering targets was measured by using TC600 (manufactured by LECO JAPAN CORPORATION) in conformity to an infrared absorbing method described in JIS Z 2613 "General rules for determination of oxygen in metallic materials". Measurement results of the In—Cu alloy powders are shown in Table 1, and evaluation results of the sputtering targets are shown in Table 4 and Table 5.

(Composition of Sputtering Target)

A fragment of each of the sputtering targets, which were obtained, was subjected to a pre-treatment with an acid, and composition analysis of In, Na, and K was performed by using ICP emission spectral analyzer (725-ES, manufactured by Agilent Technologies). Cu and the other components are described as the remainder. Evaluation results are shown in Table 4 and Table 5.

(Average Grain Size of in Single Phase, $Cu_{11}In_9$ Compound Phase, and Alkali Metal Compound)

Cross-section polisher working (CP working) was performed with respect to a working surface of each of the sputtering targets which were obtained. Then, five sheets of element mapping images (refer to FIG. 1) of each of Cu and In were photographed at a magnification of 1000 times by using a probe micro analyzer (EPMA) device (manufactured by JEOL Ltd.). From the element mapping images of Cu and In, a region in which Cu and In commonly existed was defined as the $Cu_{11}In_9$ compound phase, and a region in which only In existed was defined as the In single phase. Furthermore, the sample working may be polishing, but the polishing is not preferable when considering that diamond, SiC, and the like, which are polishing agents, may enter the In single phase.

A line segment, which crosses each of the five sheets of the element mapping images of Cu in a vertical direction, was drawn. The length of the line segment in which each of the In single phase and the $Cu_{11}In_9$ compound phase exists, and the number of each of the In single phase and the $Cu_{11}In_9$ compound phase in the line segment were measured. Then, the grain size was calculated in accordance with the following calculation expression.

(Grain size of In single phase)=(a total value of the length of the In single phase/the number of the In single phase)

(Grain size of the $Cu_{11}In_9$ compound phase)=(a total value of the length of the $Cu_{11}In_9$ compound phase/the number of the $Cu_{11}In_9$ compound phase)

The same operation was also performed in the horizontal direction, and averages of obtained values were set as grain sizes of the In single phase and the $Cu_{11}In_9$ compound phase in the photographs. In addition, the grain size of the alkali metal compound was also calculated by the same method as described above. Evaluation results are shown in Table 4 and Table 5.

(Theoretical Density Ratio)

The theoretical density ratio of the sputtering target was calculated as follows.

A Cu—In metal having a composition ratio corresponding to the sputtering target, which was obtained, was melted at 1200° C., and the molten metal was cast and gradually cooled (cooling rate: 5° C./min or less). The density of the resultant defect-free ingot (10 cm×10 cm×10 cm) that was obtained was set as "theoretical density". In the examples, the theoretical density was set as follows.

7.31 $kg/m^3$ when the amount of In contained is greater than 95 at % and equal to or less than 100 at %

7.43 $kg/m^3$ when the amount of In contained is greater than 90 at % and equal to or less than 95 at %

7.55 $kg/m^3$ when the amount of In contained is greater than 85 at % and equal to or less than 90 at %

7.66 $kg/m^3$ when the amount of In contained is greater than 80 at % and equal to or less than 85 at %

7.78 $kg/m^3$ when the amount of In contained is greater than 75 at % and equal to or less than 80 at %

7.90 $kg/m^3$ when the amount of In contained is greater than 70 at % and equal to or less than 75 at %

8.02 $kg/m^3$ when the amount of In contained is greater than 65 at % and equal to or less than 70 at %

8.14 $kg/m^3$ when the amount of In contained is greater than 60 at % and equal to or less than 65 at %

8.26 $kg/m^3$ when the amount of In contained is greater than 55 at % and equal to or less than 60 at %

8.37 $kg/m^3$ when the amount of In contained is greater than 50 at % and equal to or less than 55 at %

8.49 $kg/m^3$ when the amount of In contained is greater than 45 at % and equal to or less than 50 at %

8.61 $kg/m^3$ when the amount of In contained is 45 at %

The theoretical density ratio was calculated by using the theoretical densities, and measured densities of the sputtering targets which were obtained. Evaluation results are shown in Table 4 and Table 5.

Theoretical density ratio(%)=(measured density)/(theoretical density)×100

(Workability: Adhesion of Chip)

Lathe machining was performed with respect to each of the sputtering targets, and presence or absence of adhesion of chips during working was observed with naked eyes. Furthermore, working conditions were set as follows. Evaluation results are shown in Table 6 and Table 7.

Tool: Cemented carbide insert (TNMG160404-MJVP05RT, manufactured by Mitsubishi Materials Corporation)

Feeding: 0.7 to 1 mm/rpm

Rotation number: 70 to 100 rpm

Cutting depth per one time: 1 to 2 mm

Cutting environment: Dry (Workability: Chipping Size)

Presence or absence of chipping on an end of the sputtering target, which was obtained through the above-described working, was confirmed. In a case where chipping occurs, the maximum distance from an end surface of the sputtering target to a damaged portion was measured with digital calipers. The measurement was performed with respect to a surface, on which a damaged portion is the greatest, among surfaces which the chipping faces. Evaluation results are shown in Table 6 and Table 7.

(Workability: Surface Roughness)

Lathe machining was performed under the same conditions as described above, and measurement of surface roughness Ra was performed with a line segment in direction perpendicular to a tool mark on a surface after the lathe machining by using SURFTEST SV-3000 H4 manufactured by Mitutoyo Corporation. With respect to one sample, the measurement was performed at four sites in a region within 15 mm from an end of the sputtering target, and an average value was set as surface roughness (arithmetic average roughness) Ra of the sample. Evaluation results are shown in Table 6 and Table 7.

(Abnormal Discharge)

Film formation by sputtering was performed by using the sputtering targets which were obtained under the following conditions. Sputtering was performed by using a DC magnetron sputtering apparatus under conditions in which Ar gas was used as a sputtering gas, a flow rate was set to 50 sccm, a pressure was set to 0.67 Pa, power in two conditions of 2 $W/cm^2$ (low output) and 6 $W/cm^2$ (high output) was set as supplied power, and sputtering time was set to 30 minutes. Then, the number of times of abnormal discharge was counted by using an arc count function provided in a DC power supply device (HPK06Z-SW6 manufactured by Kyosan Electric Mfg. Co., Ltd.). Evaluation results are shown in Table 6 and Table 7.

TABLE 1

| | | Raw materials | | | | | | | | | |
|---|---|---|---|---|---|---|---|---|---|---|---|
| | | In—Cu alloy powder | | | | | Cu powder | | Alkali metal compound powder | | |
| | | In (at %) | Average particle size (μm) | In single phase existence ratio | Oxygen concentration (mass ppm) | Blending ratio (mol %) | Average particle size (μm) | Blending ratio (mol %) | Compound | Average particle size (μm) | Blending ratio (mol %) |
| Examples | 1 | 90 | 19.6 | 3.0 | 320 | 100 | — | — | — | — | — |
| | 2 | 80 | 102.6 | 2.7 | 140 | 100 | — | — | — | — | — |
| | 3 | 70 | 34.4 | 1.7 | 260 | 100 | — | — | — | — | — |
| | 4 | 60 | 28.9 | 0.8 | 270 | 100 | — | — | — | — | — |
| | 5 | 55 | 19.5 | 0.3 | 310 | 100 | — | — | — | — | — |
| | 6 | 50 | 45.6 | 0.2 | 220 | 100 | — | — | — | — | — |
| | 7 | 45 | 40.5 | 0.08 | 230 | 100 | — | — | — | — | — |
| | 8 | 55 | 43.1 | 0.3 | 160 | 96.4 | — | — | NaF | 3.2 | 3.6 |
| | 9 | 60 | 14.5 | 0.9 | 270 | 98.3 | — | — | Na$_2$S | 6.9 | 1.7 |
| | 10 | 65 | 11.5 | 1.4 | 300 | 98.6 | — | — | Na$_2$Se | 4.6 | 1.4 |
| | 11 | 60 | 10.1 | 0.8 | 140 | 97.8 | — | — | KF | 4.8 | 2.2 |
| | 12 | 70 | 24.8 | 1.8 | 330 | 98.1 | — | — | KCl | 3.7 | 1.9 |
| | 13 | 60 | 10.1 | 0.8 | 140 | 96.2 | — | — | NaCl | 3.0 | 3.8 |
| | 14 | 55 | 19.5 | 0.3 | 310 | 97.2 | — | — | K$_2$S | 4.5 | 2.8 |
| | 15 | 70 | 34.4 | 1.7 | 260 | 97.0 | — | — | K$_2$Se | 5.0 | 3.0 |
| | 16 | 60 | 122.1 | 0.9 | 110 | 90.0 | 25.7 | 10.0 | — | — | — |
| | 17 | 70 | 43.4 | 1.7 | 230 | 80.0 | 124 | 20.0 | — | — | — |
| | 18 | 65 | 14.6 | 1.5 | 370 | 92.3 | 7.3 | 5.0 | NaF | 7.3 | 2.7 |
| | 19 | 70 | 18.7 | 1.9 | 390 | 91.0 | 73.5 | 7.5 | KF | 5.5 | 1.5 |
| Comparative Examples | 1 | 100 | 56.8 | — | 220 | 100 | — | — | — | — | — |
| | 2 | 95 | 32.5 | — | 280 | 100 | — | — | — | — | — |
| | 3 | 45 | 36.8 | 0.02 | 260 | 100 | — | — | — | — | — |
| | 4 | 55 | 255 | 0.4 | 110 | 100 | — | — | — | — | — |
| | 5 | 70 | 11.2 | 1.8 | 820 | 100 | — | — | — | — | — |
| | 6 | 55 | 12.3 | 0.5 | 290 | 96.4 | — | — | NaF | 12.5 | 3.7 |
| | 7 | 55 | 14.6 | 0.4 | 250 | 97.8 | — | — | KF | 15.4 | 2.2 |
| | 8 | 40 | 65.7 | 0.0 | 210 | 100 | — | — | — | — | — |

TABLE 2

| | | Manufacturing method | | | | | |
|---|---|---|---|---|---|---|---|
| | | Manufacturing method | Atmosphere | Sintering temperature (° C.) | Pressure (kg/cm$^2$) | Retention time (min) | Cooling rate (° C./min) |
| Examples | 1 | Hot press | Ar | 125 | 300 | 180 | 1.0 |
| | 2 | Hot press | Ar | 140 | 500 | 120 | 0.5 |
| | 3 | Hot press | Vacuum | 130 | 600 | 90 | 0.6 |
| | 4 | Hot press | Vacuum | 135 | 700 | 90 | 0.9 |
| | 5 | Hot press | Ar | 135 | 800 | 60 | 0.7 |
| | 6 | Hot press | Ar | 135 | 300 | 240 | 0.7 |
| | 7 | Hot press | Vacuum | 140 | 1000 | 90 | 0.6 |
| | 8 | Hot press | Ar | 125 | 500 | 60 | 0.8 |
| | 9 | Hot press | Ar | 140 | 600 | 240 | 0.8 |
| | 10 | Hot press | Vacuum | 130 | 300 | 120 | 0.9 |
| | 11 | Hot press | Vacuum | 135 | 400 | 90 | 0.5 |
| | 12 | Hot press | Ar | 140 | 450 | 240 | 0.8 |
| | 13 | Hot press | Vacuum | 130 | 600 | 180 | 0.7 |
| | 14 | Hot press | Vacuum | 135 | 500 | 90 | 0.9 |
| | 15 | Hot press | Ar | 140 | 550 | 120 | 0.8 |
| | 16 | Hot press | Ar | 135 | 700 | 90 | 1.0 |
| | 17 | Hot press | Ar | 140 | 350 | 60 | 0.9 |
| | 18 | Hot press | Vacuum | 140 | 700 | 300 | 0.6 |
| | 19 | Hot press | Vacuum | 135 | 800 | 150 | 0.7 |
| Comparative Examples | 1 | Hot press | Ar | 110 | 400 | 90 | 1.1 |
| | 2 | Hot press | Ar | 125 | 900 | 120 | 0.5 |
| | 3 | Hot press | Vacuum | 130 | 500 | 90 | 0.8 |
| | 4 | Hot press | Vacuum | 135 | 600 | 240 | 0.6 |
| | 5 | Hot press | Ar | 125 | 300 | 240 | 0.8 |
| | 6 | Hot press | Vacuum | 130 | 500 | 210 | 0.9 |
| | 7 | Hot press | Ar | 135 | 600 | 120 | 1.0 |
| | 8 | Hot press | Ar | 130 | 700 | 90 | 0.5 |

TABLE 3

| | | Raw material blending | | Manufacturing method | | | | |
|---|---|---|---|---|---|---|---|---|
| | | In (at %) | Cu | Manufacturing method | Atmosphere | Melting temperature (° C.) | Retention time (min) | Cooling rate (° C./min) |
| Examples | 20 | 80 | Remainder | Melting and casting | Ar | 1100 | 10 | 15 |
| | 21 | 55 | Remainder | Melting and casting | Vacuum | 1200 | 30 | 20 |
| Comparative Examples | 9 | 40 | Remainder | Melting and casting | Vacuum | 1200 | 15 | 15 |
| | 10 | 100 | — | Melting and casting | Ar | 300 | 5 | 10 |
| | 11 | 55 | Remainder | Melting and casting | Ar | 1150 | 20 | 5 |

TABLE 4

| | | Target composition (at %) | | | Average grain size of $Cu_{11}In_9$ compound phase (μm) | Existence ratio of In single phase | Average grain size of In single phase (mm) | Theoretical density ratio (%) | Oxygen concentration (mass ppm) | Average particle size of alkali metal compound (μm) |
|---|---|---|---|---|---|---|---|---|---|---|
| | | In | Na | K | Cu and inevitable impurities | | | | | |
| Examples | 1 | 90.2 | — | — | Remainder | 6.0 | 2.9 | <1 | 87 | 310 | — |
| | 2 | 79.8 | — | — | Remainder | 95.6 | 2.3 | <1 | 97 | 150 | — |
| | 3 | 70.3 | — | — | Remainder | 15.0 | 1.1 | <1 | 92 | 250 | — |
| | 4 | 60.1 | — | — | Remainder | 28.7 | 0.4 | <1 | 96 | 270 | — |
| | 5 | 55.1 | — | — | Remainder | 11.0 | 0.17 | <1 | 93 | 300 | — |
| | 6 | 49.9 | — | — | Remainder | 21.6 | 0.05 | <1 | 89 | 210 | — |
| | 7 | 44.8 | — | — | Remainder | 39.0 | 0.02 | <1 | 95 | 230 | — |
| | 8 | 53.0 | 2.0 | — | Remainder | 4.0 | 0.1 | <1 | 91 | 210 | 3.5 |
| | 9 | 59.0 | 1.0 | — | Remainder | 10.1 | 0.3 | <1 | 92 | 340 | 7.2 |
| | 10 | 64.1 | 0.5 | — | Remainder | 5.0 | 0.8 | <1 | 91 | 400 | 4.9 |
| | 11 | 58.7 | — | — | Remainder | 6.2 | 0.3 | <1 | 88 | 440 | 4.0 |
| | 12 | 68.7 | — | 1.0 | Remainder | 10.0 | 1.2 | <1 | 92 | 310 | 4.5 |
| | 13 | 57.7 | 1.5 | — | Remainder | 5.7 | 0.4 | <1 | 91 | 390 | 3.4 |
| | 14 | 53.3 | — | 2.0 | Remainder | 11.6 | 0.15 | <1 | 90 | 440 | 7.3 |
| | 15 | 67.9 | — | 1.5 | Remainder | 15.8 | 1.0 | <1 | 92 | 460 | 6.4 |
| | 16 | 54.0 | — | — | Remainder | 85.0 | 0.4 | <1 | 97 | 120 | — |
| | 17 | 56.0 | — | — | Remainder | 8.0 | 1.1 | <1 | 86 | 250 | — |
| | 18 | 60.0 | 1.5 | — | Remainder | 6.0 | 0.8 | <1 | 85 | 380 | 7.8 |
| | 19 | 63.7 | — | 1.0 | Remainder | 15.0 | 1.3 | <1 | 87 | 390 | 5.7 |
| Comparative Examples | 1 | 100.0 | — | — | — | — | — | >1 | 91 | 230 | — |
| | 2 | 95.2 | — | — | Remainder | 32.5 | — | >1 | 88 | 290 | — |
| | 3 | 45.8 | — | — | Remainder | 36.8 | 0.005 | <1 | 78 | 260 | — |
| | 4 | 55.3 | — | — | Remainder | 203 | 0.1 | <1 | 87 | 110 | — |
| | 5 | 70.2 | — | — | Remainder | 11.2 | 1.3 | <1 | 81 | 810 | — |
| | 6 | 53.0 | 2.0 | — | Remainder | 12.3 | 0.08 | <1 | 86 | 370 | 14.8 |
| | 7 | 53.8 | — | 1.5 | Remainder | 14.6 | 0.09 | <1 | 87 | 410 | 17.2 |
| | 8 | 40.2 | — | — | Remainder | 65.7 | 0.0 | — | 91 | 210 | — |

TABLE 5

| | | Target composition (at %) | | | Average grain size of $Cu_{11}In_9$ compound phase (μm) | Existence ratio of In single phase | Average grain size of In single phase (mm) | Theoretical density ratio (%) | Oxygen concentration (mass ppm) | Average particle size of alkali metal compound (μm) |
|---|---|---|---|---|---|---|---|---|---|---|
| | | In | Na | K | Cu and inevitable impurities | | | | | |
| Examples | 20 | 80.0 | — | — | Remainder | 122 | 2.2 | <1 | 100 | 90 | — |
| | 21 | 55.0 | — | — | Remainder | 117 | 0.1 | <1 | 100 | 120 | — |
| Comparative Examples | 9 | 40.0 | — | — | Remainder | 121.5 | 0.0 | — | 100 | 110 | — |
| | 10 | 100.0 | — | — | — | — | — | >1 | 100 | 80 | — |
| | 11 | 55.0 | — | — | Remainder | 1300 | 1.0 | <1 | 100 | 100 | — |

TABLE 6

| | | Workability | | Surface | Number of times of abnormal discharge | |
| --- | --- | --- | --- | --- | --- | --- |
| | | Adhesion of chip | Chipping size (mm) | roughness Ra (μm) | At low power (times) | At high power (times) |
| Examples | 1 | None | None | 1.1 | 0 | 0 |
| | 2 | None | None | 0.8 | 0 | 0 |
| | 3 | None | None | 0.9 | 0 | 0 |
| | 4 | None | None | 0.7 | 0 | 0 |
| | 5 | None | None | 0.3 | 0 | 0 |
| | 6 | None | None | 0.8 | 0 | 0 |
| | 7 | None | None | 0.6 | 0 | 0 |
| | 8 | None | None | 0.9 | 0 | 0 |
| | 9 | None | None | 1.2 | 1 | 4 |
| | 10 | None | None | 0.8 | 1 | 2 |
| | 11 | None | None | 0.7 | 0 | 0 |
| | 12 | None | None | 0.8 | 0 | 0 |
| | 13 | None | None | 0.7 | 0 | 0 |
| | 14 | None | None | 1.1 | 2 | 5 |
| | 15 | None | None | 0.9 | 1 | 1 |
| | 16 | None | None | 0.9 | 0 | 0 |
| | 17 | None | None | 0.6 | 0 | 0 |
| | 18 | None | None | 1.1 | 2 | 7 |
| | 19 | None | None | 0.9 | 0 | 1 |
| Comparative Examples | 1 | Occurred | None | 1.3 | Evaluation was impossible | |
| | 2 | Occurred | None | 1.2 | Evaluation was impossible | |
| | 3 | None | 1.1 | 1.2 | 5 | 46 |
| | 4 | None | 2.1 | 1.7 | 31 | 57 |
| | 5 | None | 0.8 | 1.1 | 3 | 32 |
| | 6 | None | None | 1.2 | 73 | Difficult to continue |
| | 7 | None | None | 1.3 | 121 | Difficult to continue |
| | 8 | None | 2.5 | 1.5 | Cracking occurred during sputtering | |

TABLE 7

| | | Workability | | Surface | Number of times of abnormal discharge | |
| --- | --- | --- | --- | --- | --- | --- |
| | | Adhesion of chip | Chipping size (mm) | roughness Ra (μm) | At low power (times) | At high power (times) |
| Examples | 20 | None | None | 1.1 | 0 | 0 |
| | 21 | None | None | 0.9 | 0 | 0 |
| Comparative Example | 9 | None | Cracking occurred during working | | | | |
| | 10 | Occurred | None | 1.1 | Evaluation was impossible | |
| | 11 | None | Cracking occurred during working | | | | |

In Comparative Example 1 and Comparative Example 10 in which the amount of In contained was set to 100 at %, it could be seen that the average grain size of the In single phase was greater than 1 mm In addition, adhesion of chips was observed, and time was required for the cutting. In addition, evaluation of sputtering was impossible.

In addition, in Comparative Example 2 in which the amount of In contained was 95 at % that is greater than the range of the invention, the same result as in Comparative Example 1 was obtained.

In Comparative Example 3, the atomizing temperature when manufacturing the In—Cu alloy powder was set to 680° C., and the In single phase existence ratio was lower than a range of the invention. In Comparative Example 3, the existence ratio of In, which serves as a binder during pressure sintering, was low. Therefore, the theoretical density ratio was low, and chipping was confirmed. In addition, the number of occurrences of abnormal discharge was great.

In Comparative Example 4 in which the average grain size of the $Cu_{11}In_9$ compound phase was greater than a range of the invention, relatively large chipping was confirmed, and the surface roughness Ra was relatively great. In addition, even under the low power condition, the number of occurrences of abnormal discharge was great.

In Comparative Example 5, since the peak vacuum degree during atomizing was low, the concentration of oxygen became higher. Therefore, the concentration of oxygen was greater than a range of the invention. As a result, the theoretical density ratio was small, and chipping was confirmed. In addition, the number of times of abnormal discharge increased under the high power condition.

In Comparative Examples 6 and 7 in which the average grain size of the alkali metal compound was large, the number of times of abnormal discharge during sputtering was great. Therefore, it was difficult to continue sputtering in the high power condition.

In Comparative Example 8 in which the amount of In contained was 40 at % smaller than a range of the invention and which was manufactured by the powder sintering method, the In single phase was not formed, large chipping was confirmed, and cracking occurred during sputtering. Therefore, it was difficult to evaluate the number of times of abnormal discharge.

In Comparative Example 9 in which the amount of In contained was 40 at % smaller than a range of the invention, and which was manufactured by the melting and casting method, cracking occurred during working.

In Comparative Example 11 in which the cooling rate during casting was slower than a range of the invention, the average grain size of $Cu_{11}In_9$ compound phase was very large. Therefore, cracking occurred during working.

In contrast, Examples 1 to 19 which were manufactured by the powder sintering method, and Examples 20 and 21 which were manufactured by the melting and casting method, adhesion of chips and occurrence of chipping were not confirmed, and the surface roughness was sufficiently small. Accordingly, the cutting workability was excellent. In addition, it was confirmed that the number of times of abnormal discharge during sputtering was small, and stable film formation through sputtering was possible.

INDUSTRIAL APPLICABILITY

According to the invention, it is possible to provide a sputtering target that is formed from an In—Cu alloy, is excellent in workability, and is capable of suppressing occurrence of abnormal discharge during sputtering, and a method of manufacturing the sputtering target.

REFERENCE SIGNS LIST

S11: Raw material blending step
S12: Melting step
S13: Casting step
S21: In—Cu alloy powder preparing step
S22: Sintering step

The invention claimed is:

1. A sputtering target having a composition, containing:
   45 at % to 90 at % of In, and
   the remainder including Cu and inevitable impurities,
   wherein an In single phase and a $Cu_{11}In_9$ compound phase exist, and an XRD peak ratio $I(In)/I(Cu_{11}In_9)$ between the In single phase and the $Cu_{11}In_9$ compound phase is in a range of 0.01 to 3,
   an average grain size of the $Cu_{11}In_9$ compound phase is 150 μm or less,
   an amount of oxygen is 500 mass ppm or less, and
   a theoretical density ratio is 85% or more.

2. The sputtering target according to claim 1,
   wherein an average grain size of the In single phase is 1 mm or less.

3. The sputtering target according to claim 1, further containing:
   one or more selected from the group consisting of NaF, NaCl, $Na_2S$, and $Na_2Se$ as a Na compound,
   wherein an average grain size of the Na compound is 10 μm or less.

4. The sputtering target according to claim 1, further containing:
   one or two selected from the group consisting of KF, KCl, $K_2S$, and $K_2Se$ as a K compound,
   wherein an average grain size of the K compound is 10 μm or less.

* * * * *